(12) United States Patent  
Katoh et al.

(10) Patent No.: US 7,825,694 B2  
(45) Date of Patent: Nov. 2, 2010

(54) DIFFERENTIAL OUTPUT CIRCUIT

(75) Inventors: Toshie Katoh, Tokyo (JP); Junko Nakamoto, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/551,978

(22) Filed: Sep. 1, 2009

(65) Prior Publication Data

US 2010/0079172 A1    Apr. 1, 2010

(30) Foreign Application Priority Data

Sep. 29, 2008    (JP) .............................. 2008-250873

(51) Int. Cl.
*H03K 19/094* (2006.01)
(52) U.S. Cl. .......................................... 326/83; 326/82
(58) Field of Classification Search .............. 326/82–87
See application file for complete search history.

(56) References Cited

U.S. PATENT DOCUMENTS 5,977,796 A * 11/1999 Gabara ........................ 326/86

6,646,482 B2 * 11/2003 Takeuchi .................... 327/112
7,228,116 B2    6/2007 Cheng et al.
7,256,626 B2 * 8/2007 Nguyen et al. .............. 327/112
2003/0164811 A1    9/2003 Kim et al.

FOREIGN PATENT DOCUMENTS

| JP | 2003-316338 A | 11/2003 |
| JP | 2004-112453 A | 4/2004 |
| WO | WO 2005/043769 A1 | 5/2005 |

* cited by examiner

*Primary Examiner*—Don P Le
(74) *Attorney, Agent, or Firm*—Arent Fox LLP

(57) ABSTRACT

A differential output circuit including a first output driving circuit that includes a first PMOS transistor and a first NMOS transistor connected in series to each other, a second output driving circuit that includes a second PMOS transistor and a second NMOS transistor connected in series to each other and a control circuit, wherein, when a control signal has a first value, the control circuit selectively turns on one of the first and second PMOS transistors and selectively turns on one of the first and second NMOS transistors, thereby controlling the first and second output driving circuits to output a first pair of differential signals, and when the control signal has a second value, the control circuit supplies no current to the PMOS transistors and selectively turns on one of the NMOS transistors, thereby controlling the output driving circuits to output a second pair of differential signals.

10 Claims, 16 Drawing Sheets

DIFFERENTIAL OUTPUT CIRCUIT

CROSS REFERENCES TO RELATED APPLICATIONS

This application is based upon and claims the benefit of priority from the prior Japanese Patent Application No. 2008-250873 filed on Sep. 29, 2008, the entire contents of which are incorporated herein by reference.

BACKGROUND

1. Field of the Invention

The present invention relates to a differential output circuit that outputs differential signals.

2. Description of Related Art

As the resolution of an image is increased, devices, such as camera sensors, plasma display panels, and liquid crystal displays, need to transmit large amounts of data at a high speed. In order to transmit a large amount of data at a high speed, a high-speed signal transmission system using small-amplitude signals is required. In a differential small-amplitude interface standard, such as an LVDS (low voltage differential signal) standard or a CML (current mode logic) standard, used instead of a CMOS interface, for example, timing or noise problems have been solved, and there is an attempt to reduce power consumption. In addition, the differential small-amplitude interface standards, such as an RSDS (reduced swing differential signaling) standard, a mini-LVDS standard, and a subLVDS standard, have been used.

The above-mentioned various standards are used for the purpose of signal transmission, and different interface circuits are used according to the standards. The interfaces are the same except for the structure of a receiving end or the electrical characteristics of an output signal, and it is possible to change the structure of an output circuit to correspond to a plurality of different standards.

International Publication No. WO2005/043769 discloses a structure in which a plurality of output circuits corresponding to a plurality of different standards are provided, the outputs of the output circuits are connected to each other, and the output circuits are switched according to the standard used. However, the structure having a plurality of output circuits corresponding to a plurality of different standards has problems such as when a chip area is increased, a leakage current is increased.

SUMMARY

According to an aspect of the embodiment, a differential output circuit includes, a first output driving circuit that includes a first PMOS transistor and a first NMOS transistor connected in series to each other, a second output driving circuit that includes a second PMOS transistor and a second NMOS transistor connected in series to each other; and a control circuit, wherein, when a control signal has a first value, the control circuit selectively turns on one of the first and second PMOS transistors and selectively turns on one of the first and second NMOS transistors, thereby controlling the first and second output driving circuits to output a first pair of differential signals, and when the control signal has a second value, the control circuit supplies no current to the first and second PMOS transistors and selectively turns on one of the first and second NMOS transistors, thereby controlling the first and second output driving circuits to output a second pair of differential signals.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DETAILED DESCRIPTION OF THE PREFERRED EMBODIMENTS

Hereinafter, exemplary embodiments of the invention will be described in detail with reference to the accompanying drawings.

Figure 1:
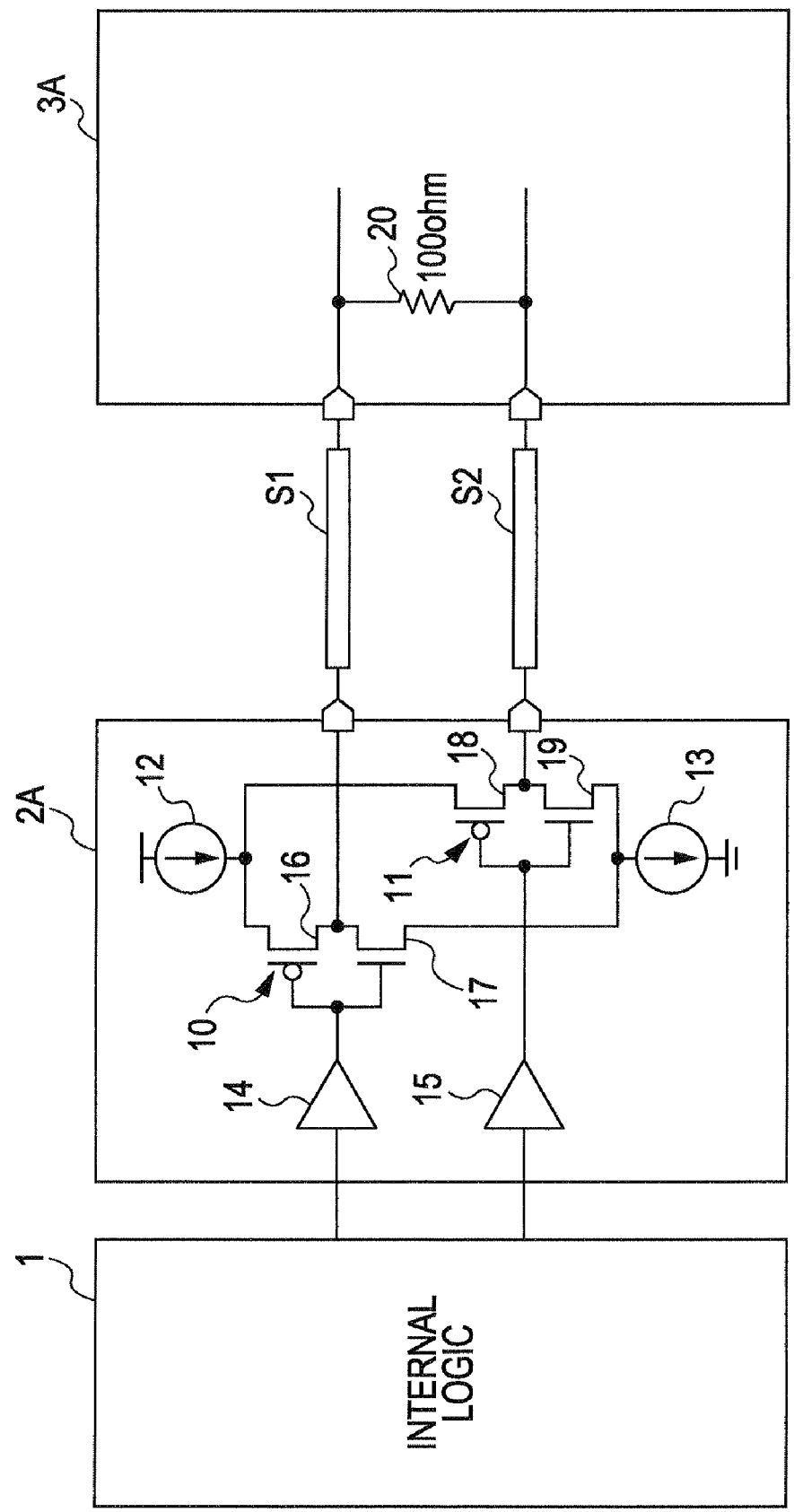
FIG. 1 is a diagram illustrating an example of the structure of a signal transmitting system based on an LVDS standard.

FIG. 1 is a diagram illustrating an example of the structure of a signal transmitting system based on an LVDS standard. A subLVDS standard, a mini-LVDS standard, and a RSDS standard are substantially similar to the LVDS standard except for current and voltage conditions. As such, these standards can use the output circuit structure illustrated in FIG. 1.

The signal transmitting system illustrated in FIG. 1 includes an internal logic 1, such as a multiplexer, a differential output circuit 2A that outputs a pair of differential signals, and a differential input circuit 3A that receives the pair of differential signals. The differential output circuit 2A includes an output driving circuit 10, an output driving circuit 11, a current source circuit 12, a current source circuit 13, a buffer 14, and a buffer 15. The output driving circuit 10 includes a PMOS transistor 16 and an NMOS transistor 17 connected in series to each other. The output driving circuit 11 includes a PMOS transistor 18 and an NMOS transistor 19 connected in series to each other. The output driving circuit 11 is connected in parallel to the output driving circuit 10. Each of the current source circuits 12 and 13 is connected in series to the output driving circuit 10 and the output driving circuit 11, respectively. The internal logic 1 outputs a first signal and a second signal having opposite phases. The first signal output from the internal logic 1 is applied to the gates of the transistors 16 and 17 of the output driving circuit 10 through the buffer 14. The second signal output from the internal logic 1 is applied to the gates of the transistors 18 and 19 of the output driving circuit 11 through the buffer 15. In this way, the output driving circuits 10 and 11 output a pair of differential signals to signal lines S1 and S2, respectively.

In the differential input circuit 3A, a resistive element 20 is connected between the signal line S1 and the signal line S2. In this way, a current flows from the current source circuit 12 to the ground through the signal line S1 or S2, the resistive element 20, the signal line S2 or S1, and the current source circuit 13, and a predetermined signal voltage is generated between the receiving ends of the signal lines S1 and S2. The differential input circuit 3 detects the signal voltage. The resistance value of the resistive element 20 is 100Ω.

In the LVDS standard, a current of 3.5 mA flows to the resistive element 20, and a differential signal amplitude voltage of 350 mV is detected at the receiving ends. In the sub-LVDS standard, a current of 1.5 mA flows to the resistive element 20, and a differential signal amplitude voltage of 150 mV is detected at the receiving ends. In the mini-LVDS standard, a current of 4.0 mA flows to the resistive element 20, and a differential signal amplitude voltage of 400 mV is detected at the receiving ends. In the RSDS standard, a current of 2.0 mA flows to the resistive element 20, and a differential signal amplitude voltage of 200 mV is detected at the receiving ends.

Figure 2:
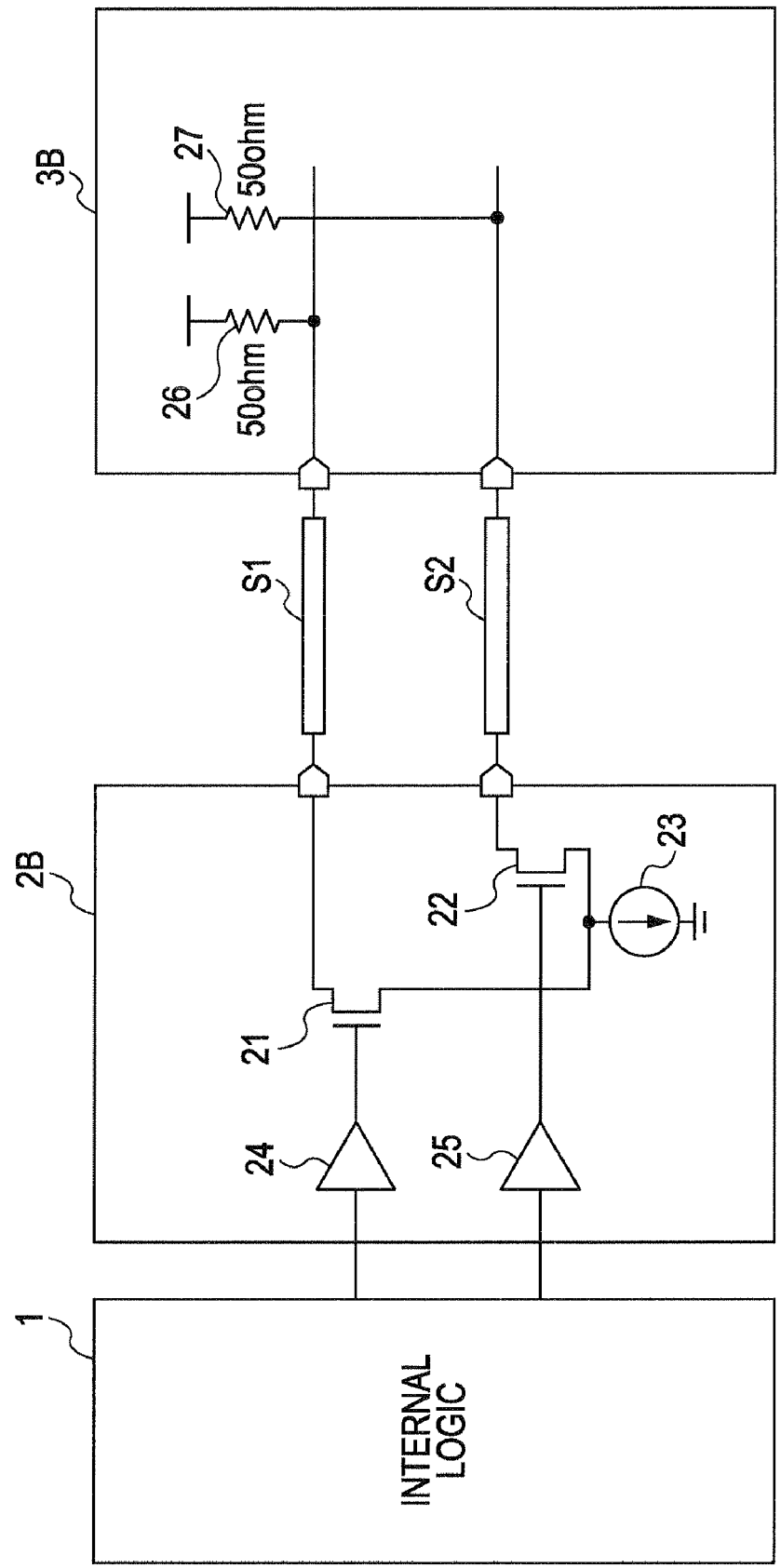
FIG. 2 is a diagram illustrating an example of the structure of a signal transmitting system based on a CML standard.

FIG. 2 is a diagram illustrating an example of the structure of a signal transmitting system based on the CML standard. The signal transmitting system illustrated in FIG. 2 includes an internal logic 1, such as a multiplexer, a differential output circuit 2B that outputs a pair of differential signals, and a differential input circuit 3B that receives the pair of differential signals. The differential output circuit 2B includes an NMOS transistor 21, an NMOS transistor 22, a current source circuit 23, a buffer 24, and a buffer 25. The current source circuit 23 is connected in series to the NMOS transistor 21 and the NMOS transistor 22. The internal logic 1 outputs a first signal and a second signal having opposite phases. The first signal output from the internal logic 1 is applied to the gate of the NMOS transistor 21 through the buffer 24. The second signal output from the internal logic 1 is applied to the gate of the NMOS transistor 22 through the buffer 25. In this way, the NMOS transistor 21 and the NMOS transistor 22 output a pair of differential signals to the signal lines S1 and S2, respectively.

In the differential input circuit 3B, a resistive element 26 is connected between the signal line S1 and a power supply voltage terminal, and a resistive element 27 is connected between the signal line S2 and the power supply voltage terminal. In this way, a current flows from the resistive element 26 or 27 to the ground through the signal lines S1 or S2 and the current source circuit 23, and a predetermined signal voltage is generated between the receiving ends of the signal lines S1 and S2. The differential input circuit 3 detects the signal voltage. The resistance value of each of the resistive elements 26 and 27 is 50Ω.

In the CML standard, a current of 8.0 mA flows to the resistive element 26 or 27, and a differential signal amplitude voltage of 400 mV is detected at the receiving ends. A power supply voltage is generally 3.3 V.

Figure 3:
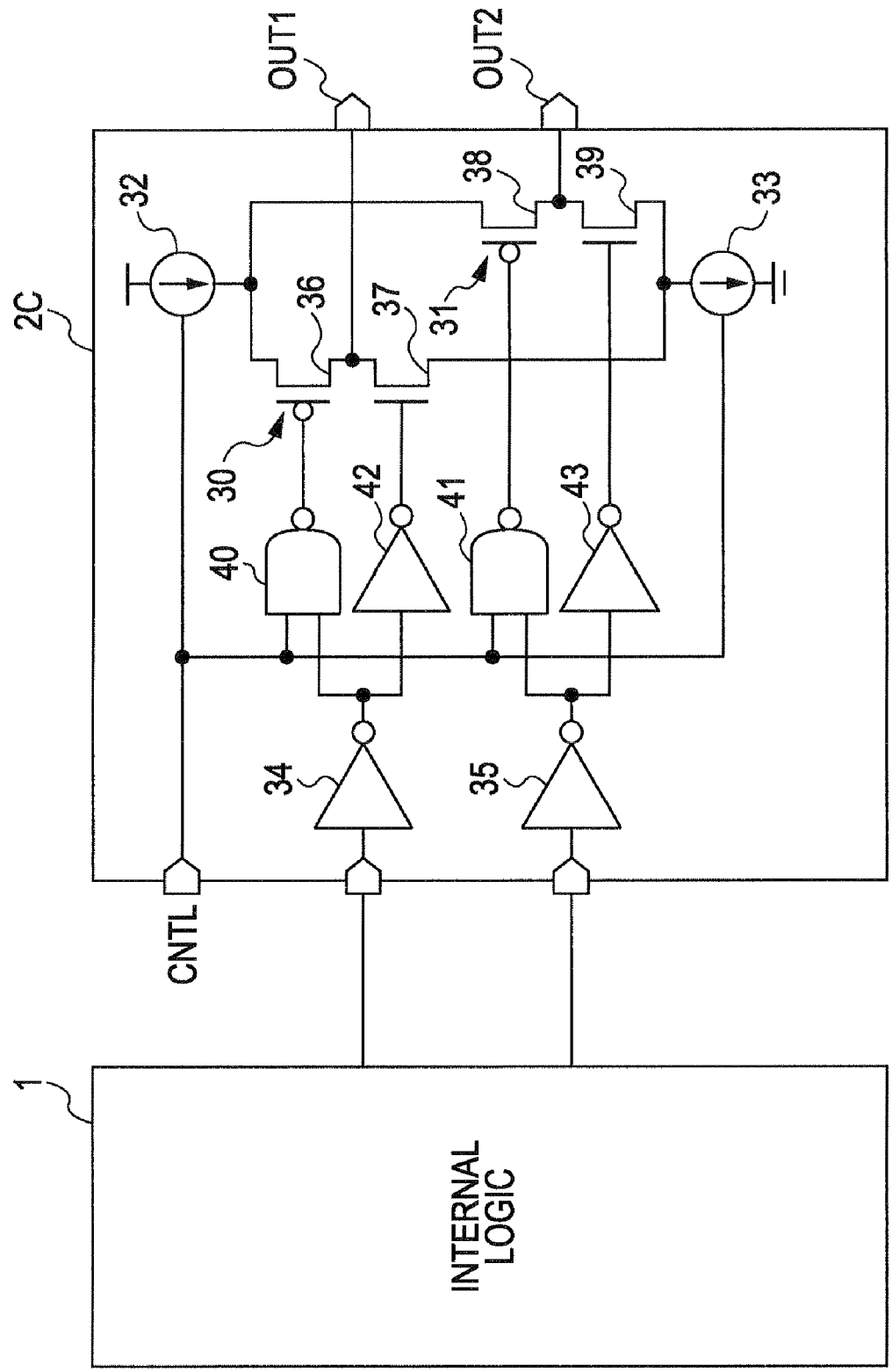
FIG. 3 is a diagram illustrating the structure of a differential output circuit according to a first embodiment that can correspond to a plurality of different differential small-amplitude interface standards.

FIG. 3 is a diagram illustrating a differential output circuit according to a first embodiment that can correspond to a plurality of different differential small-amplitude interface standards. A differential output circuit 2C illustrated in FIG. 3 can correspond to at least the LVDS standard, the subLVDS standard, the mini-LVDS standard, the RSDS standard, and the CML standard.

The differential output circuit 2C includes an output driving circuit 30, an output driving circuit 31, a current source circuit 32, a current source circuit 33, an inverter 34, an inverter 35, a NAND circuit 40, a NAND circuit 41, an inverter 42, and an inverter 43. The output driving circuit 30 includes a PMOS transistor 36 and an NMOS transistor 37 connected in series to each other. The output driving circuit 31 includes a PMOS transistor 38 and an NMOS transistor 39 connected in series to each other. The output driving circuit 31 is connected in parallel to the output driving circuit 30. Each of the current source circuits 32 and 33 is connected in series to the output driving circuit 30 and the output driving circuit 31, respectively.

The internal logic 1 outputs a first signal and a second signal having opposite phases (e.g., opposite logic values). The first signal output from the internal logic 1 is applied to a first input of the NAND circuit 40 through the inverter 34. A control signal CNTL is applied to a second input of the NAND circuit 40. An output signal from the NAND circuit 40 is applied to the gate of the PMOS transistor 36 of the output driving circuit 30. The first signal output from the internal logic 1 is also applied to the gate of the NMOS transistor 37 of the output driving circuit 30 through the inverters 34 and 42.

Similarly, the second signal output from the internal logic 1 is applied to a first input of the NAND circuit 41 through the inverter 35. The control signal CNTL is applied to a second input of the NAND circuit 41. An output signal from the NAND circuit 41 is applied to the gate of the PMOS transistor 38 of the output driving circuit 31. The second signal output from the internal logic 1 is also applied to the gate of the NMOS transistor 39 of the output driving circuit 31 through the inverters 35 and 43.

According to the above-mentioned structure, when the control signal CNTL has a first value (high level), one of the PMOS transistors 36 and 38 is selectively turned on, and the other PMOS transistor is turned off. In addition, one of the NMOS transistors 37 and 39 is selectively turned on and the other NMOS transistor is turned off. Further, the transistor to be turned on is selected according to the signal output from the internal logic 1. In this way, it is possible to output a first pair of differential signals from the output driving circuits 30 and 31 to the output terminals OUT1 and OUT2, respectively. On the other hand, when the control signal CNTL has a second value (low level), no current is supplied to the PMOS transistors 36 and 38. In addition, one of the NMOS transistors 37 and 39 is selectively turned on, and the other NMOS transistor is turned off. In this way, it is possible to output a second pair of differential signals from the output driving circuits 30 and 31 to the output terminals OUT1 and OUT2, respectively. This control operation based on the control signal CNTL is performed by a control circuit including the NAND circuits 40 and 41 and the inverters 42 and 43. The control signal CNTL may be supplied from the internal logic 1. Alternatively, the control signal CNTL may be supplied from the outside of an integrated circuit chip including the internal logic 1 and the differential output circuit 2C.

According to the above-mentioned control operation, in the LVDS mode in which the control signal CNTL is at a high level, the differential output circuit 2C illustrated in FIG. 3 performs substantially similar to circuit operation as the differential output circuit 2A illustrated in FIG. 1. In addition, in the CML mode in which the control signal CNTL is at a low level, the differential output circuit 2C illustrated in FIG. 3 performs substantially similar to circuit operation as the differential output circuit 2B illustrated in FIG. 1. As such, it is possible to correspond to both the LVDS standard and the CML standard according to the value of the control signal CNTL.

The amount of current flowing through the current source circuit 32 or 33 connected in series to the output driving circuits 30 and 31 varies depending on the control signal CNTL. Therefore, it is possible to adjust the current and voltage characteristics of the differential output signals according to each standard. In this way, even when any of the differential input circuits 3A and 3B illustrated in FIGS. 1 and 2 is connected to the receiving end, it is possible to use the differential output circuit 2C illustrated in FIG. 3 to correspond to the connection.

The differential output circuit 2C uses the NMOS transistors 37 and 39 in both the LVDS mode and the CML mode. Therefore, it is possible to significantly reduce the area of a circuit, as compared to the structure in which the differential output circuit 2A and the differential output circuit 2B are individually mounted and the output terminals thereof are connected to each other. The NAND circuits 40 and 41 and the inverters 42 and 43 are required for the control operation. The gate width of the transistor used for the logic circuit is about one hundredth of the gate width of each of the output driving transistors 36 to 39. In this way, it is possible to provide a differential output circuit that can correspond to a plurality of different differential small-amplitude interface standards and prevent an increase in the area of a circuit.

Figure 4:
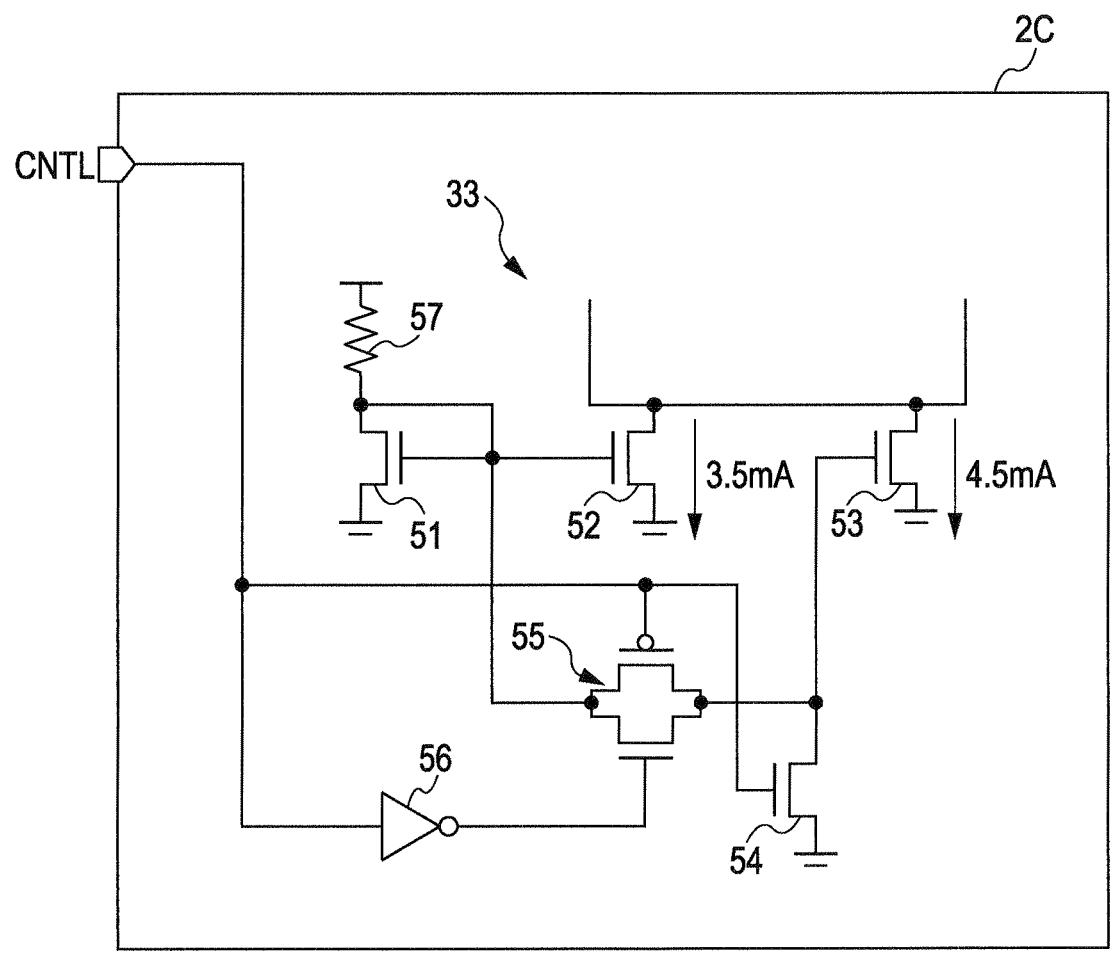
FIG. 4 is a diagram illustrating an example of the structure of a current source circuit.

FIG. 4 is a diagram illustrating an example of the structure of the current source circuit 33. The current source circuit 33 illustrated in FIG. 4 includes NMOS transistors 51 to 54, a transmission gate 55 including an NMOS transistor and a PMOS transistor connected in parallel to each other, an inverter 56, and a resistive element 57.

The NMOS transistor 51 and the resistive element 57 connected in series to each other are connected between the power supply voltage terminal and the ground. The voltage of a connection point between the NMOS transistor 51 and the resistive element 57 is applied to the gate of the NMOS transistor 51. In this way, a predetermined fixed amount of current flows to the NMOS transistor 51. The same voltage as that applied to the gate of the NMOS transistor 51 is applied to the gate of the NMOS transistor 52. In addition, when the control signal CNTL is at a low level, the transmission gate 55 is turned on, and the same voltage as that applied to the gate of the NMOS transistor 51 is applied to the gate of the NMOS transistor 53. The ratio of the gate width of the NMOS transistor 51, the gate width of the NMOS transistor 52, and the gate width of the NMOS transistor 53 is set to, for example, 1:7:9. In this exemplary case, a current of 0.5 mA flows to the NMOS transistor 51, a current of 3.5 mA flows to the NMOS transistor 52, and a current of 4.5 mA flows to the NMOS transistor 53.

According to the above-mentioned structure, in the LVDS mode in which the control signal CNTL is at a high level, a current of 3.5 mA flows through the current source circuit 33, and it is possible to achieve the LVDS standard. In the CML mode in which the control signal CNTL is at a low level, a current of 8.0 mA (=3.5 mA+4.5 mA) flows through the current source circuit 33, and it is possible to achieve the CML standard.

Figure 5:
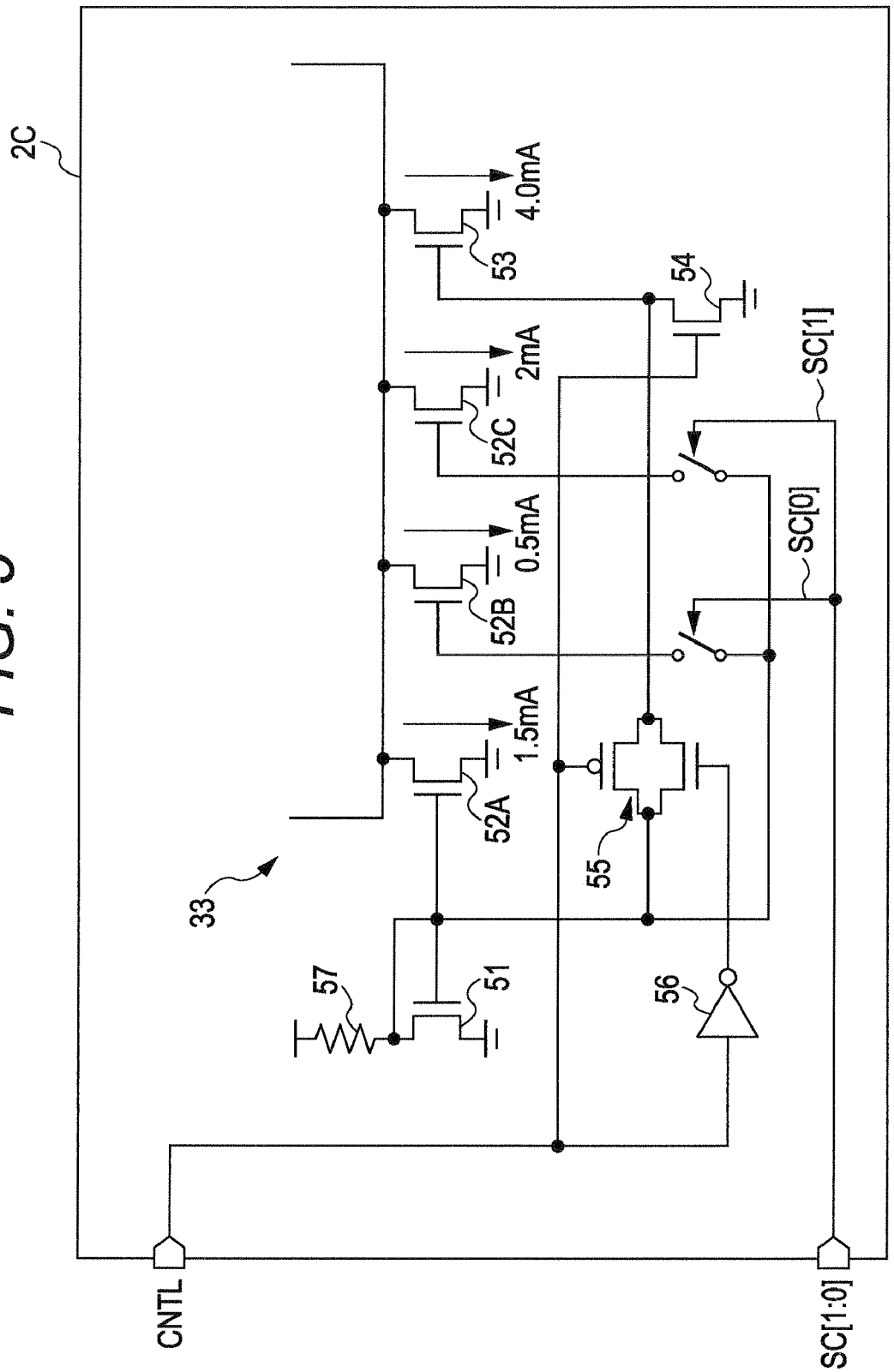
FIG. 5 is a diagram illustrating another example of the structure of the current source circuit.

FIG. 5 is a diagram illustrating another example of the structure of the current source circuit 33. In the current source circuit 33 illustrated in FIG. 5, NMOS transistors 52A/52B, and 52C are provided instead of the NMOS transistor 52 of the current source circuit 33 illustrated in FIG. 4. The same voltage as that applied to the gate of the NMOS transistor 51 is applied to the gates of the NMOS transistors 52A to 52C. However, in the depicted example, a 2-bit selection signal SC[1:0] is supplied to the differential output circuit 2C, and the application of the voltage to the gate of the NMOS transistor 52B is controlled by SC[0], which is one of the two bits. In addition, the application of the voltage to the gate of the NMOS transistor 52C is controlled by SC[1], which is the other bit. The voltage application control is performed by a switching circuit illustrated in FIG. 5. The switching circuit is turned on when a corresponding selection signal is "1", and the same transmission gate as the transmission gate 55 may be used as the switching circuit. In addition, a unit that allows the gate of a corresponding transistor to function at a low level (for example, a circuit element such as the NMOS transistor 54) with the switching circuit turned off may be provided.

The ratio of the gate width of the NMOS transistor 51, the gate width of the NMOS transistor 52A, the gate width of the NMOS transistor 52B, the gate width of the NMOS transistor 52C, and the gate width of the NMOS transistor 53 is set to, for example, 1:3:1:4:8. In this exemplary case, a current of 0.5 mA flows to the NMOS transistor 51, currents of 1.5 mA, 0.5 mA, and 2.0 mA flow to the NMOS transistors 52A, 52B, and 52C, respectively, and a current of 4.0 mA flows to the NMOS transistor 53.

According to the above-mentioned structure, the amount of current flowing through the current source circuit 33 varies depending on the selection signal SC[1:0] in addition to the control signal CNTL. In the LVDS mode in which the control signal CNTL is at a high level, when the selection signal SC[1:0] is "00", a current of 1.5 mA flows through the current source circuit 33, and it is possible to achieve the subLVDS standard. When the selection signal SC[1:0] is "01", a current of 2.0 mA flows through the current source circuit 33, and it is possible to achieve the RSDS standard. When the selection signal SC[1:0] is "10", a current of 3.5 mA flows through the current source circuit 33, and it is possible to achieve the LVDS standard. When the selection signal SC[1:0] is "11", a current of 4.0 mA flows through the current source circuit 33, and it is possible to achieve the mini-LVDS standard. In the CML mode in which the control signal CNTL is at a low level, the selection signal SC[1:0] is set to "11", and a current of 8.0 mA flows through the current source circuit 33. Therefore, it is possible to achieve the CML standard.

Figure 6:
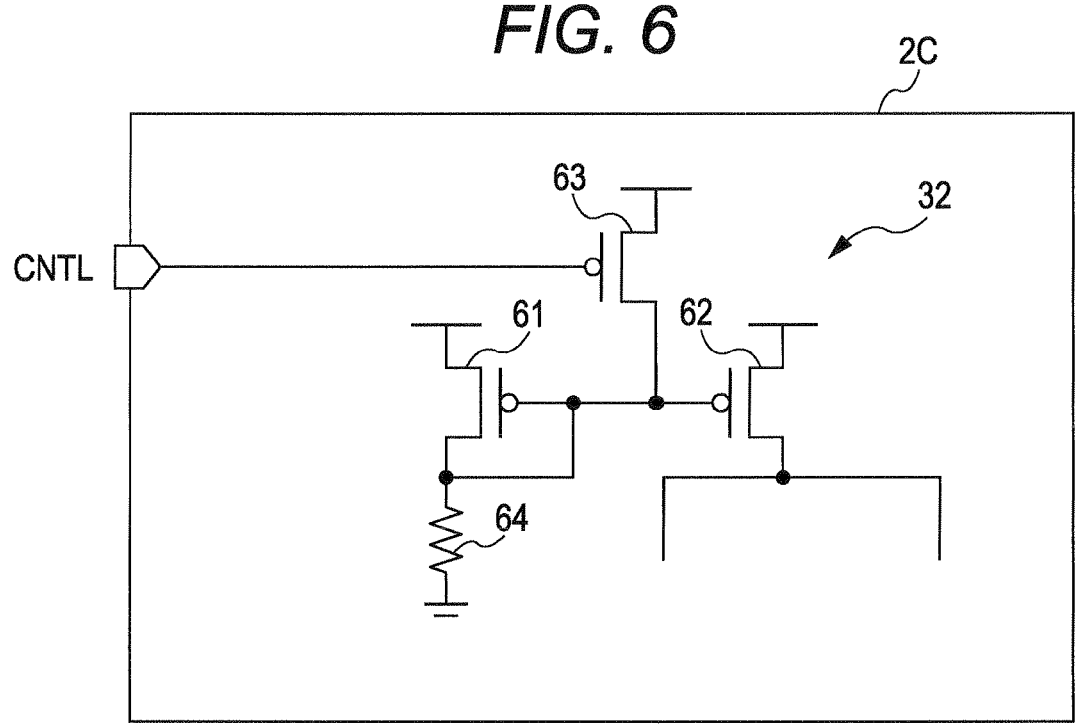
FIG. 6 is a diagram illustrating an example of the structure of a current source circuit.

FIG. 6 is a diagram illustrating an example of the structure of the current source circuit 32. The current source circuit 32 illustrated in FIG. 6 includes PMOS transistors 61 to 63 and a resistive element 64. The PMOS transistor 61 and the resistive element 64 connected in series to each other are connected between the power supply voltage terminal and the ground. The voltage of a connection point between the PMOS transistor 61 and the resistive element 64 is applied to the gate of the PMOS transistor 61. In this way, a predetermined fixed amount of current flows to the PMOS transistor 61. The same voltage as that applied to the gate of the PMOS transistor 61 is applied to the gate of the PMOS transistor 62. In this way, a predetermined fixed amount of current can flow to the PMOS transistor 62. Specifically, in the depicted example, a current of 8 mA corresponding to at least the CML standard may flow. The amount of current actually applied to the PMOS transistor 62 is controlled by the current source circuit 33 as illustrated in FIG. 4 or 5.

The control signal CNTL is applied to the gate of the PMOS transistor 63. When the control signal CNTL is at a low level, the PMOS transistor 63 is turned on, a high-level voltage is applied to the gate of the PMOS transistor 62, and no current flows to the PMOS transistor 62. That is, in the LVDS mode in which the control signal CNTL is at a high level, a current flows to the current source circuit 32. In the CML mode in which the control signal CNTL is at a low level, no current flows to the current source circuit 32. This control operation makes it possible that no current flows to the PMOS transistors 36 and 38 (see FIG. 3) when the control signal CNTL is at a low level. Therefore, in this exemplary case, even if the gate voltages of the PMOS transistors 36 and 38 are not fixed to a high level, no current flows to the PMOS transistors 36 and 38.

Figure 7:
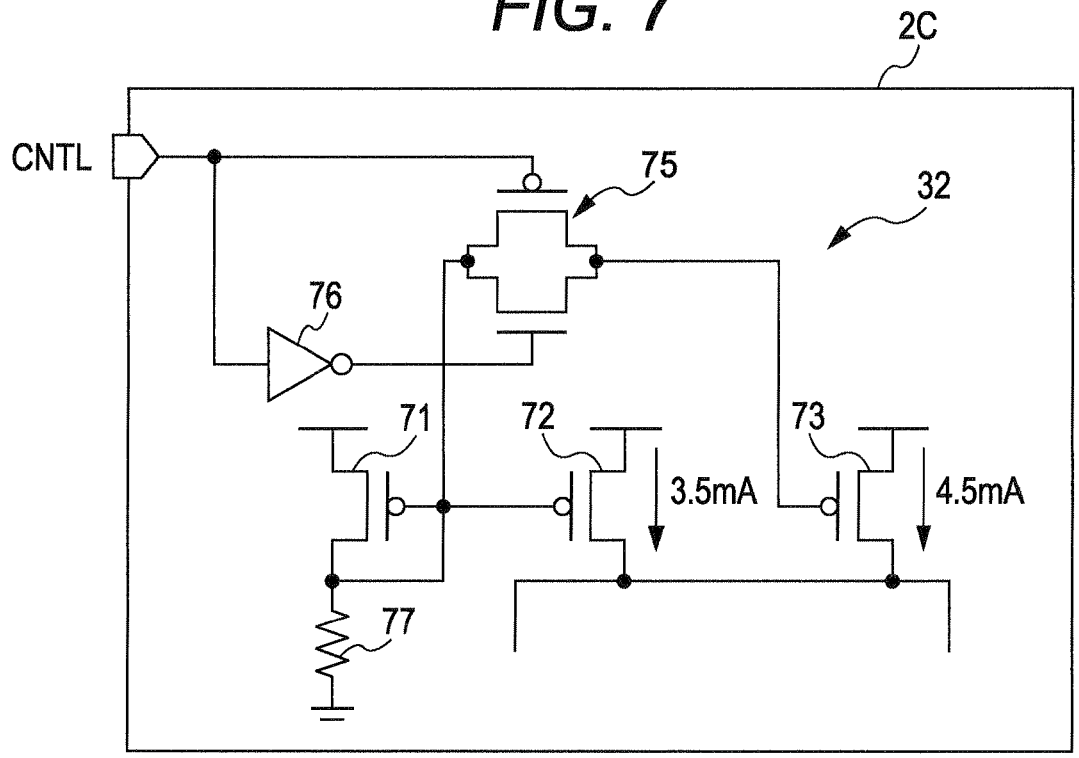
FIG. 7 is a diagram illustrating another example of the structure of the current source circuit.

FIG. 7 is a diagram illustrating another example of the current source circuit 32. The current source circuit 32 illustrated in FIG. 7 is used in the structure that switches the amount of current between the LVDS mode and the CML mode at a power supply voltage side, not a ground voltage side. When this structure is used, an NMOS transistor that enables a maximum of 8.0 mA to flow may be used as the ground-voltage-side current source circuit 33. The current source circuit 32 illustrated in FIG. 7 includes PMOS transistors 71 to 73, a transmission gate 75 including an NMOS transistor and a PMOS transistor connected in parallel to each other, an inverter 76, and a resistive element 77.

The PMOS transistor 71 and the resistive element 77 connected in series to each other are connected between the power supply voltage terminal and the ground. The voltage of a connection point between the PMOS transistor 71 and the resistive element 77 is applied to the gate of the PMOS transistor 71. In this way, a predetermined fixed amount of current flows to the PMOS transistor 71. The same voltage as that applied to the gate of the PMOS transistor 71 is applied to the gate of the PMOS transistor 72. When the control signal CNTL is at a low level, the transmission gate 75 is turned on, and the same voltage as that applied to the gate of the PMOS transistor 71 is applied to the gate of the PMOS transistor 73. In the depicted example, the ratio of the gate width of the PMOS transistor 71, the gate width of the PMOS transistor 72, and the gate width of the PMOS transistor 73 is set to, for example, 1:7:9. In this case, a current of 0.5 mA flows to the PMOS transistor 71, a current of 3.5 mA flows to the PMOS transistor 72, and a current of 4.5 mA flows to the PMOS transistor 73.

According to the above-mentioned structure, in the LVDS mode in which the control signal CNTL is at a high level, a current of 3.5 mA flows through the current source circuit 32, and it is possible to achieve the LVDS standard. In the CML mode in which the control signal CNTL is at a low level, a current of 8.0 mA (=3.5 mA+4.5 mA) flows through the current source circuit 32, and it is possible to achieve the CML standard.

Figure 8:
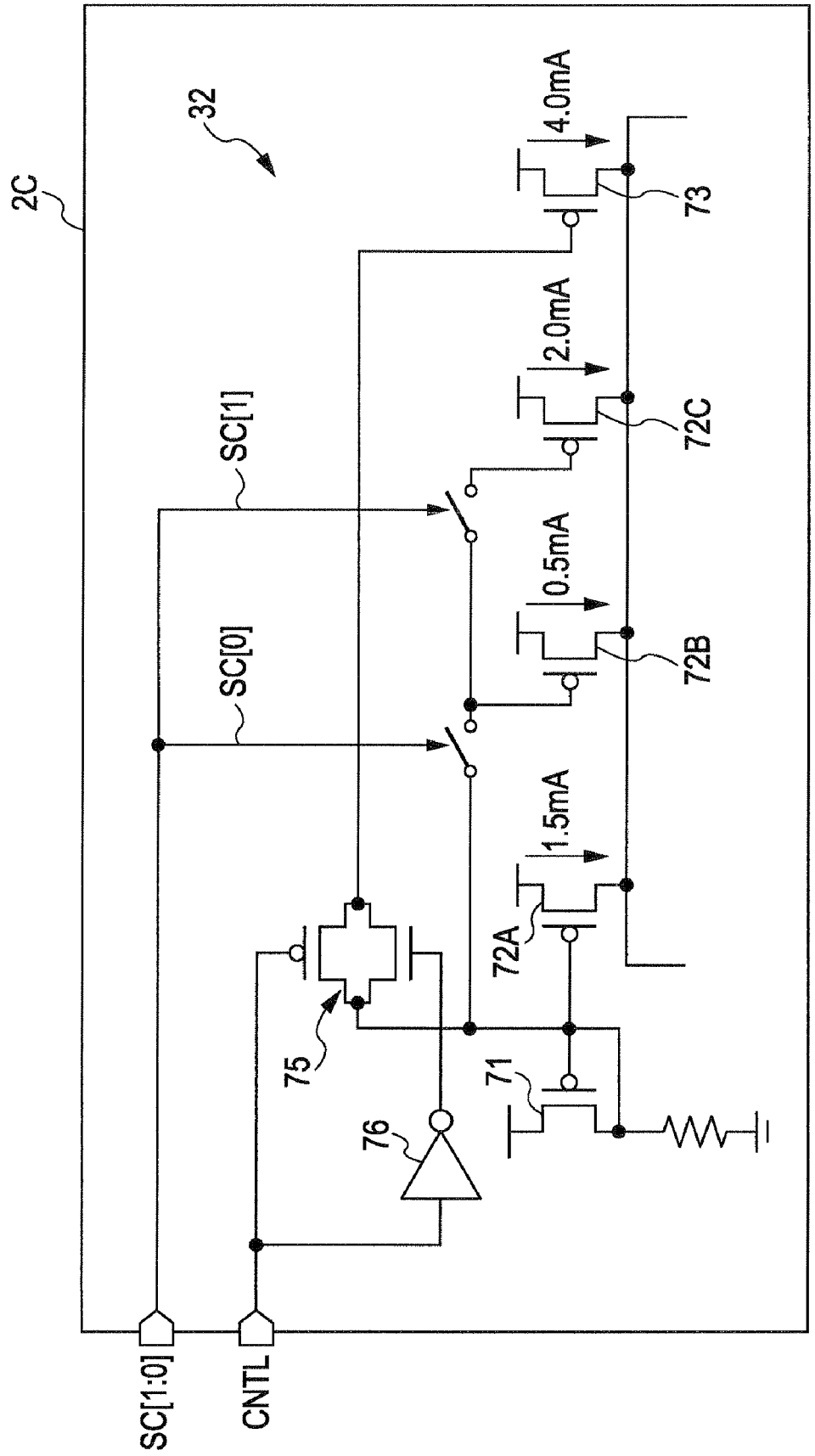
FIG. 8 is a diagram illustrating still another example of the structure of the current source circuit.

FIG. 8 is a diagram illustrating still another example of the structure of the current source circuit 32. In the current source circuit 32 illustrated in FIG. 8, PMOS transistors 72A, 72B, and 72C are provided instead of the PMOS transistor 72 of the current source circuit 32 illustrated in FIG. 7. The same voltage as that applied to the gate of the PMOS transistor 71 is applied to the gates of the PMOS transistors 72A to 72C. However, a 2-bit selection signal SC[1:0] is supplied to the differential output circuit 2C, and the application of the voltage to the gate of the PMOS transistor 72B is controlled by SC[0], which is one of the two bits. In addition, the application of the voltage to the gate of the PMOS transistor 72C is controlled by SC[1], which is the other bit. The voltage application control is performed by a switching circuit as illustrated in FIG. 8. The switching circuit is turned on when a corresponding selection signal is "1", and the same transmission gate as the transmission gate 75 may be used as the switching circuit. In addition, a unit that makes the gate of a corresponding transistor at a high level with each switching circuit or transmission gate turned off may be provided.

In the depicted example, the ratio of the gate width of the PMOS transistor 71, the gate width of the PMOS transistor 72A, the gate width of the PMOS transistor 72B, the gate width of the PMOS transistor 72C, and the gate width of the PMOS transistor 73 is set to, for example, 1:3:1:4:8. In this case, a current of 0.5 mA flows to the PMOS transistor 71, currents of 1.5 mA, 0.55 mA, and 2.0 mA flow to the PMOS transistor 72A, 72B, and 72C, respectively, and a current of 4.0 mA flows to the PMOS transistor 73.

According to the above-mentioned structure, the amount of current flowing through the current source circuit 32 varies depending on the selection signal SC[1:0] in addition to the control signal CNTL. In the LVDS mode in which the control signal CNTL is at a high level, when the selection signal SC[1:0] is "00", a current of 1.5 mA flows through the current source circuit 32, and it is possible to achieve the subLVDS standard. When the selection signal SC[1:0] is "01", a current of 2.0 mA flows through the current source circuit 32, and it is possible to achieve the RSDS standard. When the selection signal SC[1:0] is "10", a current of 3.5 mA flows through the current source circuit 32, and it is possible to achieve the LVDS standard. When the selection signal SC[1:0] is "11", a current of 4.0 mA flows through the current source circuit 32, and it is possible to achieve the mini-LVDS standard. In the CML mode in which the control signal CNTL is at a low level, the selection signal SC[1:0] is set to "11", and a current of 8.0 mA flows through the current source circuit 32. Therefore, it is also possible to achieve the CML standard.

Figure 9:
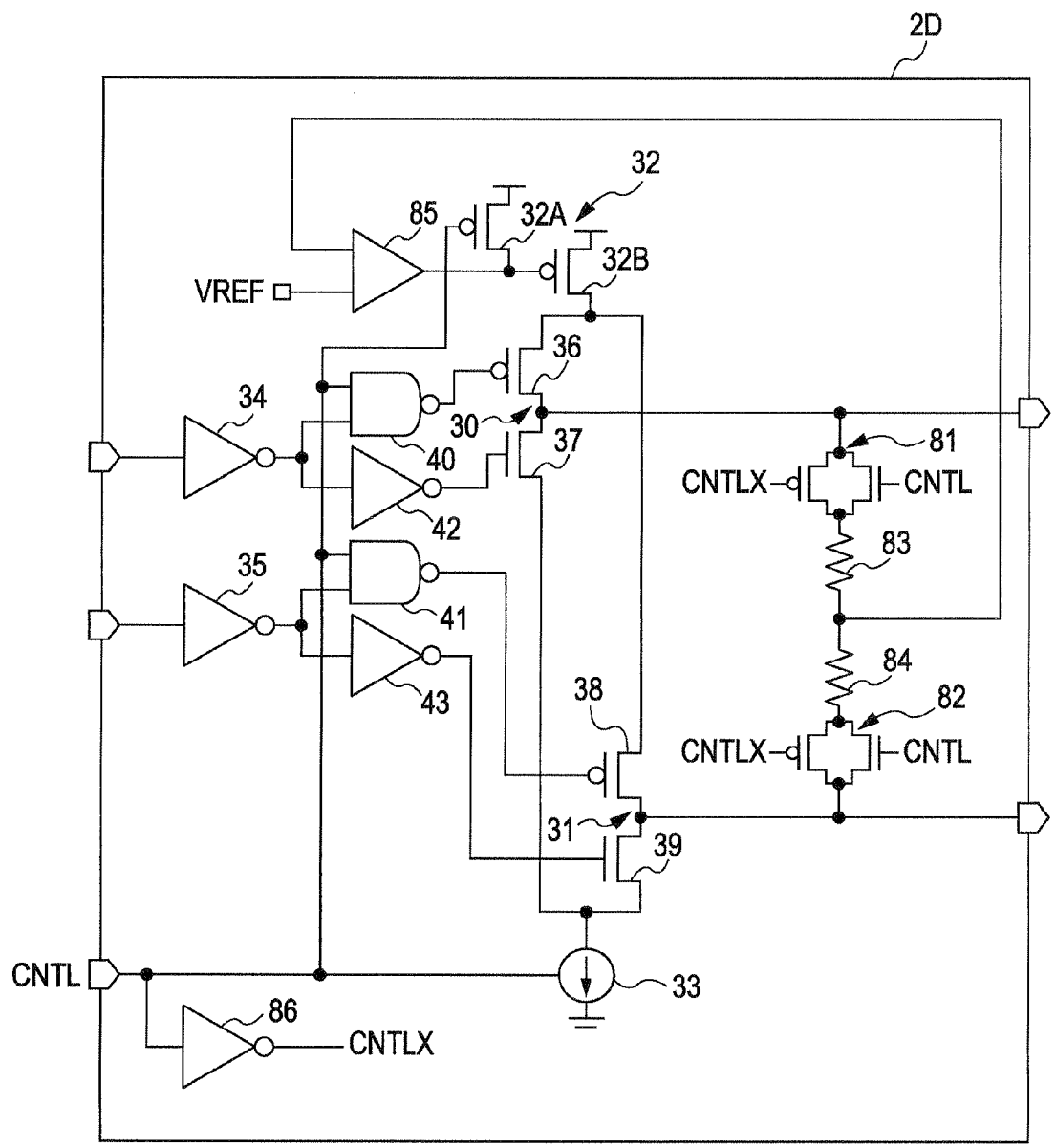
FIG. 9 is a diagram illustrating the structure of a differential output circuit according to a second embodiment.

FIG. 9 is a diagram illustrating the structure of a differential output circuit according to a second embodiment. In FIG. 9, the same components as those in FIG. 3 are denoted by the same reference numerals, and a description thereof will be omitted. A differential output circuit 2D illustrated in FIG. 9 includes transmission gates 81 and 82, resistive elements 83 and 84, an amplifier 85, and an inverter 86 in addition to the components of the differential output circuit 2C as illustrated in FIG. 3. The current source circuit 32 includes PMOS transistors 32A and 32B. Each of the transmission gates 81 and 82 includes a PMOS transistor and an NMOS transistor connected in parallel to each other. A control signal CNTL is applied to the gate of the NMOS transistor of each of the transmission gates 81 and 82. In addition, an inverted signal CNTLX of the control signal CNTL output from the inverter 86 is applied to the gate of the PMOS transistor of each of the transmission gates 81 and 82.

The resistive elements 83 and 84 each have a large resistance value of about 1 KΩ, and detect a center voltage between the differential output signals when the transmission gates 81 and 82 are turned on. The amplifier 85 serves as a feedback circuit that changes the amount of current flowing through the current source circuit 32 according to the difference between the detection value of the center voltage and a predetermined reference voltage VREF. This common feedback control makes it possible to set a common mode signal of the differential output (the central voltage between the differential output signals) to be equal to the reference voltage VREF. In the CML mode in which the control signal CNTL is at a low level, the transmission gates 81 and 82 are turned off, and a center voltage detecting operation stops.

Figure 10:
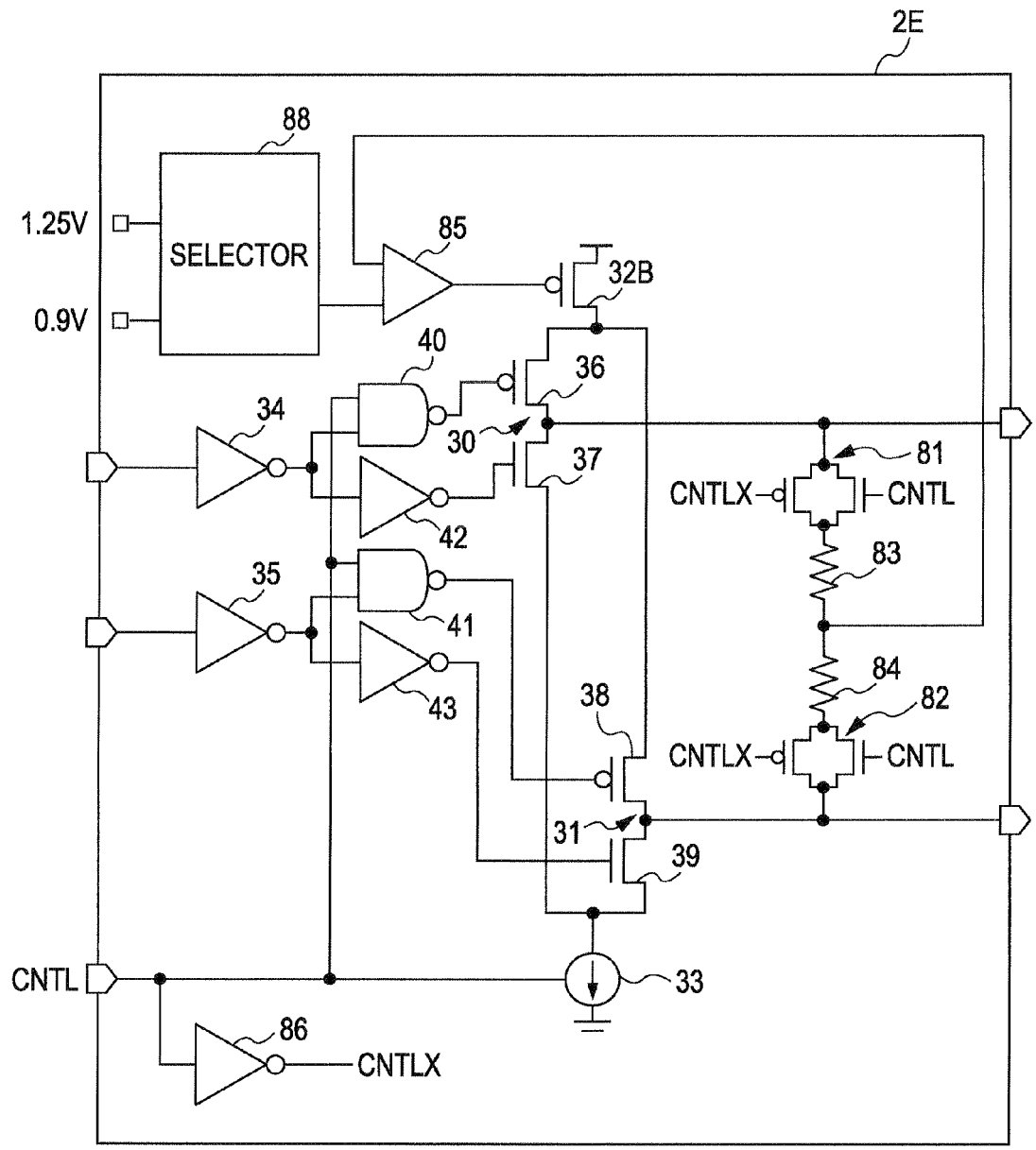
FIG. 10 is a diagram illustrating the structure of a differential output circuit according to a modification of the second embodiment.

FIG. 10 is a diagram illustrating the structure of a differential output circuit according to a modification of the second embodiment. In FIG. 10, the same components as those in FIG. 9 are denoted by the same reference numerals, and a description thereof will be omitted. A differential output circuit 2E illustrated in FIG. 10 includes a selector 88 in addition to the components of the differential output circuit 2D as illustrated in FIG. 9. The selector 88 selects one of two input voltages of 1.25 V and 0.9 V, and supplies the selected voltage (1.25 V or 0.9 V) to the amplifier 85. The input voltage may be selected on the basis of, for example, a selection signal applied from the outside. In this way, it is possible to change the common mode signal (the central voltage between the differential output signals) by changing the value of the reference voltage VREF.

Figure 11:
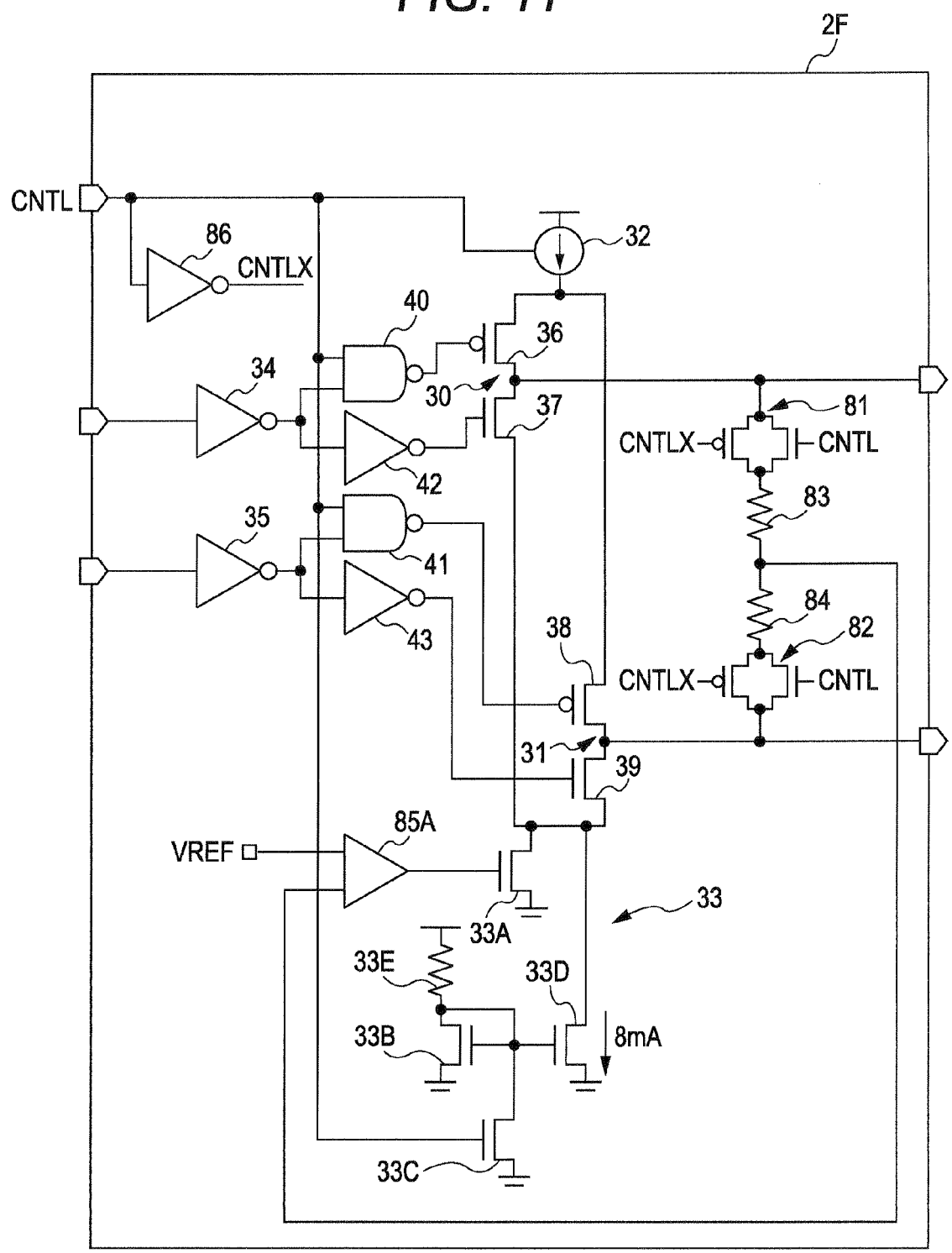
FIG. 11 is a diagram illustrating the structure of a differential output circuit according to another modification of the second embodiment.

FIG. 11 is a diagram illustrating the structure of a differential output circuit according to another modification of the second embodiment. In FIG. 11, the same components as those in FIG. 9 are denoted by the same reference numerals, and a description thereof will be omitted. A differential output circuit 2F illustrated in FIG. 11 includes an amplifier 85A, instead of the amplifier 85 of the differential output circuit 2D as illustrated in FIG. 9. The current source circuit 33 includes NMOS transistors 33A to 33D and a resistive element 33E. In this structure, it is possible to set the common mode signal (the central voltage between the differential output signals) to be equal to the reference voltage VREF by controlling the amount of current flowing through the ground-voltage-side current source circuit 33, as opposed to the amount of current flowing through the power-supply-voltage-side current source circuit 32, such as the structure illustrated in FIG. 9. The control of the amount of current by common feedback is performed by controlling the gate voltage of the NMOS transistor 33A.

Figure 12:
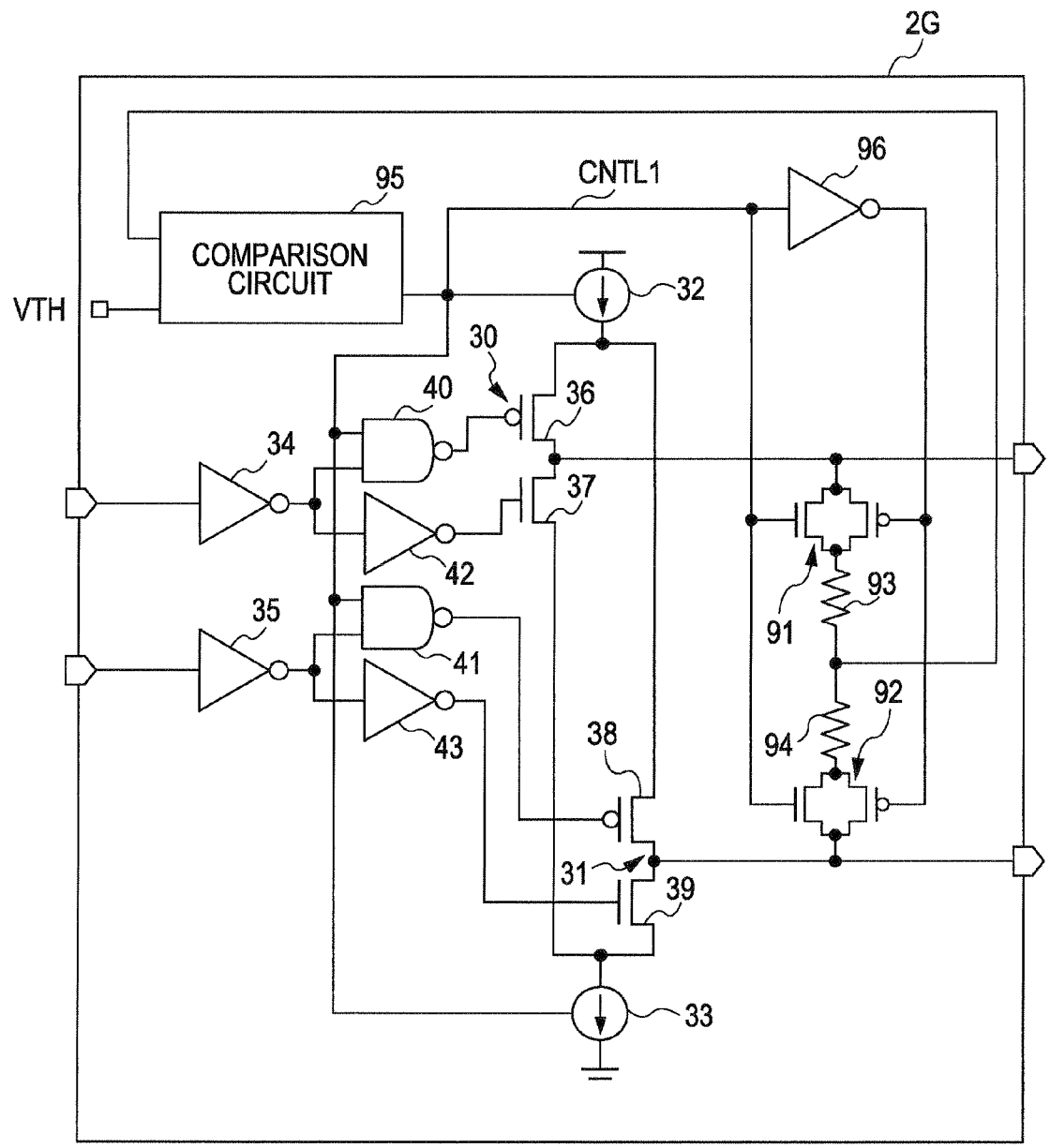
FIG. 12 is a diagram illustrating the structure of a differential output circuit according to a third embodiment.

FIG. 12 is a diagram illustrating the structure of a differential output circuit according to a third embodiment. In FIG. 12, the same components as those in FIG. 3 are denoted by the same reference numerals, and a description thereof will be omitted. A differential output circuit 2G illustrated in FIG. 12 includes transmission gates 91 and 92, resistive elements 93 and 94, a comparison circuit 95, and an inverter 96, in addition to the components of the differential output circuit 2C illustrated in FIG. 3. Each of the transmission gates 91 and 92 includes a PMOS transistor and an NMOS transistor connected in parallel to each other. A control signal CNTL1, which is the output of the comparison circuit 95, is applied to the gate of the NMOS transistor in each of the transmission gates 91 and 92. In addition, an inverted signal of the control signal CNTL1 output from the inverter 96 is applied to the gate of the PMOS transistor in each of the transmission gates 91 and 92.

The resistive elements 93 and 94 each have a resistance value of about 1 KΩ, and detect the center voltage between the differential output signals when the transmission gates 91 and 92 are turned on. The comparison circuit 95 compares the detection value of the center voltage with a predetermined threshold voltage VTH, and changes the value of the control signal CNTL1 on the basis of the comparison result. This control operation makes it possible to automatically perform switching between the LVDS mode and the CML mode.

In the system using the interface standard, such as the LVDS or CML standard, there is little necessity to instantaneously change a transmission method, and the standard may be switched and set when the system starts. In the structure illustrated in FIG. 12, at the beginning of start-up, the LVDS mode in which the control signal CNTL1 is at a high level is set as a default. In this case, the center voltage detected by the resistive elements 93 and 94 varies depending on whether the differential input circuit connected to the receiving end is the differential input circuit 3A for the LVDS standard or the differential input circuit 3B for the CML standard.

When the power supply voltage is 3.3 V and the differential input circuit 3A illustrated in FIG. 1 is connected to the receiving end, the center voltage between the high-level output voltage and the low-level output voltage of the differential output circuit 2G is around 1.65 V. When the differential input circuit 3B illustrated in FIG. 2 is connected to the receiving end, the high-level output voltage of the differential output circuit 2G is 3.3 V, and the low-level output voltage is about 3.125 V (=3.3 V−50Ω×3.5 mA). As a result, the center voltage is around 3.2 V. Therefore, the threshold voltage VTH input to the comparison circuit 95 is set to, for example, 2.0 V and the center voltage detection value is compared with the threshold voltage VTH. Then, it is possible to determine whether a circuit connected to the receiving end is the differential input circuit 3A or the differential input circuit 3B on the basis of the magnitude relationship as the result. If the center voltage is greater than or equal to the threshold voltage VTH, the differential input circuit 3B is connected to the receiving end, and the differential output circuit 2G should be operated in the CML mode. Therefore, the comparison circuit 95 sets the control signal CNTL1 to a low level. On the other hand, if the center voltage is less than or equal to the threshold voltage VTH, the differential input circuit 3A is connected to the receiving end, and the differential output circuit 2G should be operated in the LVDS mode. Therefore, the comparison circuit 95 sets the control signal CNTL1 to a high level. In this way, it is possible to automatically set the LVDS mode and the CML mode.

Figure 13:
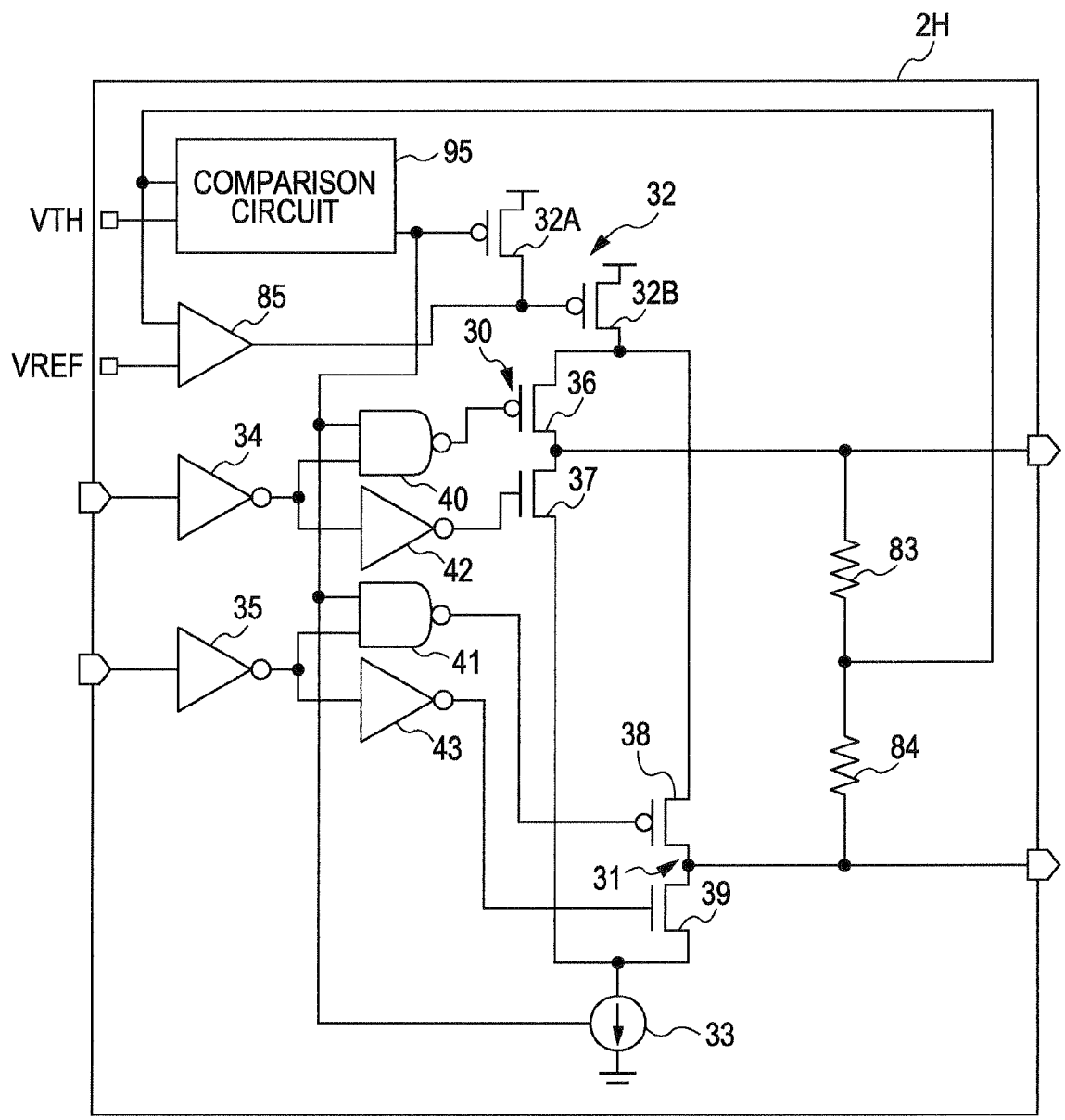
FIG. 13 is a diagram illustrating the structure of a differential output circuit according to a modification of the third embodiment.

FIG. 13 is a diagram illustrating the structure of a differential output circuit according to a modification of the third embodiment. In FIG. 13, the same components as those in FIGS. 9 and 12 are denoted by the same reference numerals and a description thereof will be omitted. A differential output circuit 2H illustrated in FIG. 13 performs both the common mode feedback control operation by the amplifier 85 illustrated in FIG. 9 and the automatic mode setting operation by the comparison circuit 95 illustrated in FIG. 12. In this case, the resistive elements 83 and 84 that detect the center voltage can be used for both the common mode feedback control operation and the automatic mode setting operation. In the differential output circuit 2H, the resistive elements 83 and 84 for calculating an output center voltage are connected to output signal lines. This structure makes it possible to monitor the output center voltage all the time, automatically detect whether the operation mode is the LVDS mode or the CML mode all the time, and switch the operation mode at any time.

Figure 14:
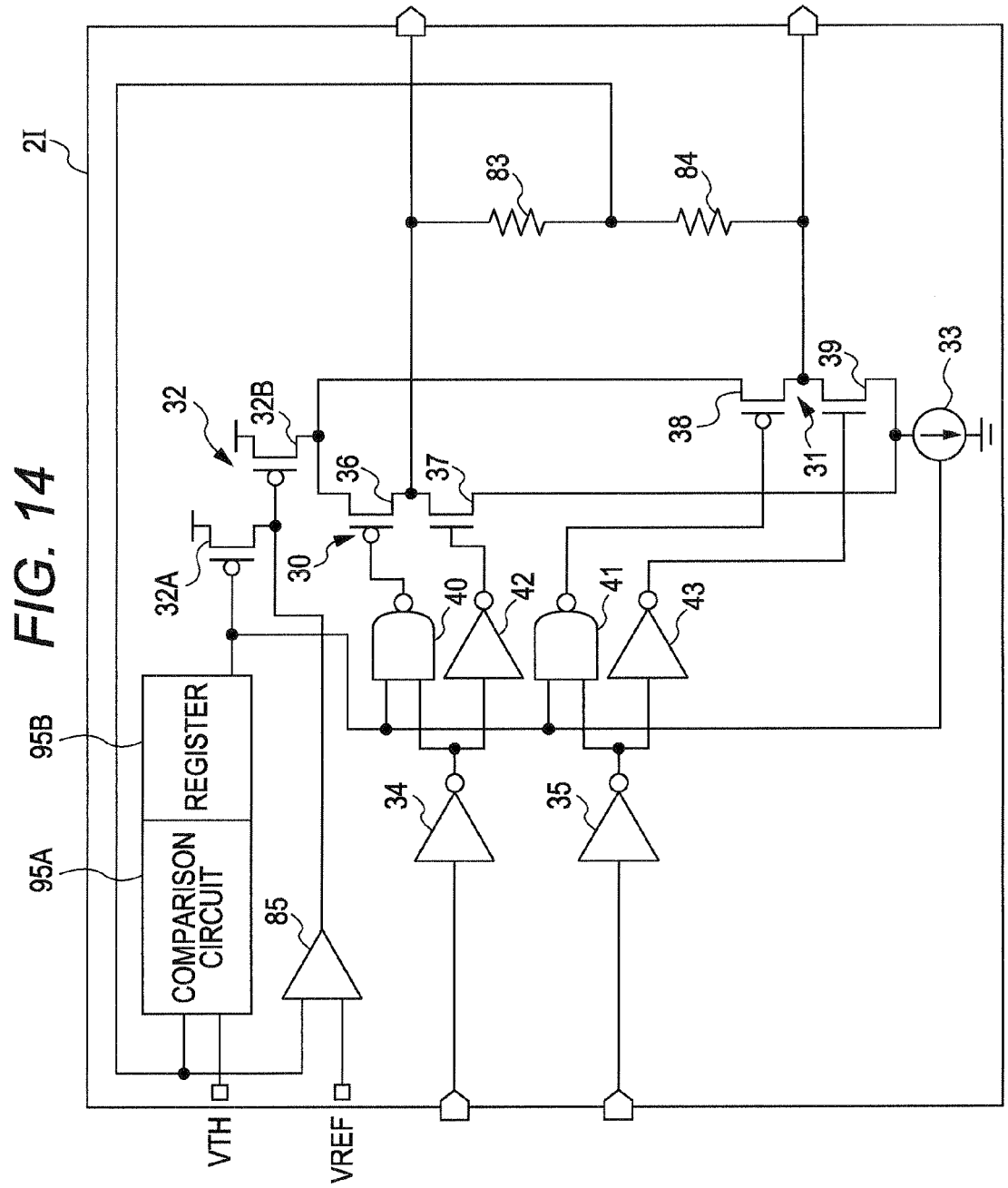
FIG. 14 is a diagram illustrating the structure of a differential output circuit according to another modification of the third embodiment.

FIG. 14 is a diagram illustrating the structure of a differential output circuit according to another modification of the third embodiment. In FIG. 14, the same components as those in FIG. 13 are denoted by the same reference numerals, and a description thereof will be omitted. A differential output circuit 2I illustrated in FIG. 14 includes a comparison circuit 95A and a register circuit 95B, instead of the comparison circuit 95 in the differential output circuit 2G illustrated in FIG. 9. In this structure, the comparison circuit 95A compares the center voltage detection value with the threshold value voltage VTH and outputs the control signal CNTL1 according to the comparison result. Then, the register circuit 95B stores the control signal CNTL1. The operation mode of the differential output circuit 2I is set by the control signal CNTL1 output from the register circuit 95B. For example, when the output of the comparison circuit 95A is maintained at the same value for greater than or equal to a predetermined time, the output of the comparison circuit 95A is stored in the register circuit 95B. In this way, it is possible to achieve a stable operation without noise affects.

Figure 15:
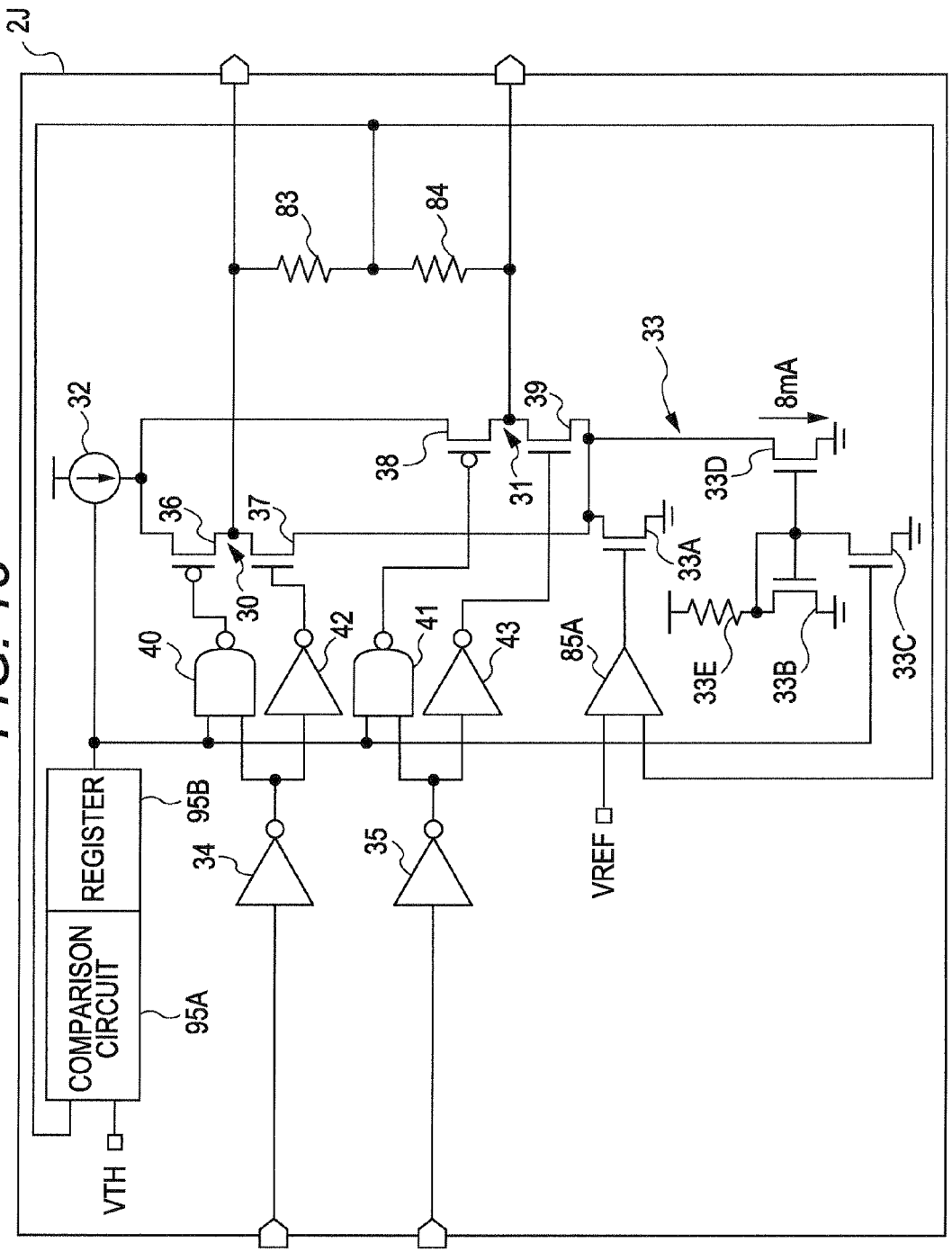
FIG. 15 is a diagram illustrating the structure of a differential output circuit according to still another modification of the third embodiment.

FIG. 15 is a diagram illustrating the structure of a differential output circuit according to still another modification of the third embodiment. In FIG. 15, the same components as those in FIGS. 11 and 14 are denoted by the same reference numerals, and a description thereof will be omitted. A differential output circuit 23 illustrated in FIG. 15 includes an amplifier 85A, instead of the amplifier 85 of the differential output circuit 2I illustrated in FIG. 14. In addition, the current source circuit 33 includes NMOS transistors 33A to 33D and a resistive element 33E. In this structure, it is possible to set a common mode signal (the central voltage between the differential output signals) to be equal to the reference voltage VREF by controlling the amount of current flowing through the ground-voltage-side current source circuit 33, as opposed to the amount of current flowing through the power-supply-voltage-side current source circuit 32, as the structure illustrates in FIG. 14. The control of the amount of current by common feedback is performed by controlling the gate voltage of the NMOS transistor 33A.

Figure 16:
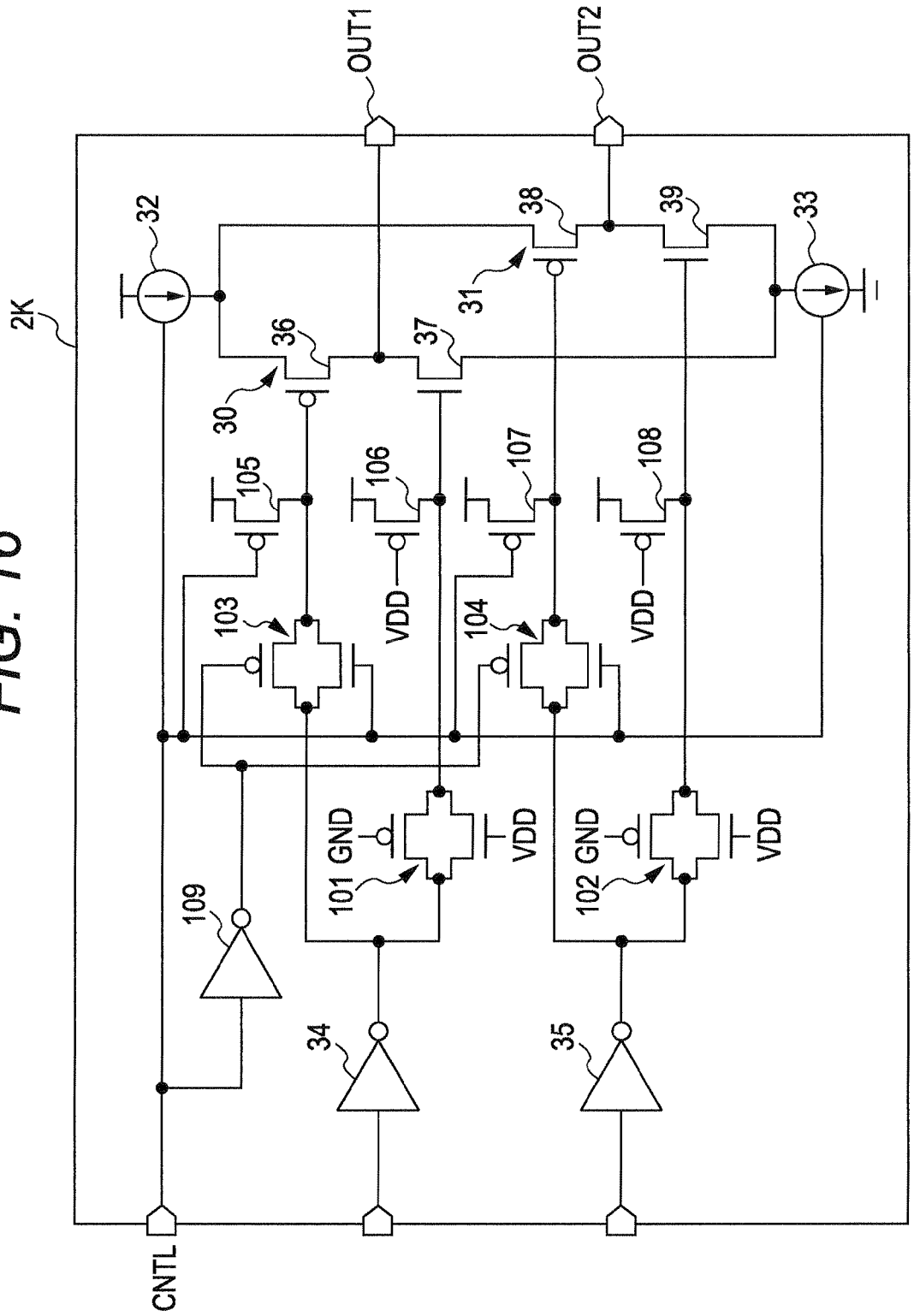
FIG. 16 is a diagram illustrating the structure of a differential output circuit according to a fourth embodiment.

FIG. 16 is a diagram illustrating the structure of a differential output circuit according to a fourth embodiment. In FIG. 16, the same components as those in FIG. 3 are denoted by the same reference numerals, and a description thereof will be omitted. In the differential output circuit, when the control signal CNTL has a first value (high level), one of the PMOS transistors 36 and 38 may be selectively turned on, and one of the NMOS transistors 37 and 39 may be selectively turned. On the other hand, when the control signal CNTL has a second value (low level), no current may be supplied to the PMOS transistors 36 and 38, and one of the NMOS transistors 37 and 39 may be selectively turned on. The structure of a control circuit for performing this control operation is not limited to that illustrated in FIG. 3.

In a differential output circuit 2K illustrated in FIG. 16, the control circuit includes transmission gates 101 to 104 each having a PMOS transistor and an NMOS transistor connected in parallel to each other, PMOS transistors 105 to 108, and an inverter 109. The transmission gates 101 and 102 and the PMOS transistors 106 and 108 are set to be turned on all the time. The transmission gates 103 and 104 are turned on when the control signal CNTL is at a high level, and are turned off when the control signal CNTL is at a low level. The PMOS transistors 106 and 108 are turned off when the control signal CNTL is at a high level, and are turned on when the control signal CNTL is at a low level. The transmission gates 101 and 102 and the PMOS transistors 106 and 108 are provided as dummy circuits for setting loads for input signals at the PMOS side and the NMOS side of the output driving circuit substantially equal to each other.

In the structure illustrated in FIG. 16, when the control signal CNTL is at a high level, one of the PMOS transistors 36 and 38 is selectively turned on, and the other PMOS transistor is turned off. In addition, one of the NMOS transistors 37 and 39 is selectively turned on, and the other NMOS transistor is turned off. In this case, the transistor to be turned on is selected according to the signal output from the internal logic. In this way, it is possible to output a pair of differential signals from the output driving circuits 30 and 31 to the output terminals OUT1 and OUT2, respectively. On the other hand, when the control signal CNTL is at a low level, no current is supplied to the PMOS transistors 36 and 38. In addition, one of the NMOS transistors 37 and 39 is selectively turned on, and the other NMOS transistor is turned off. In this way, it is possible to output a pair of differential signals from the output driving circuits 30 and 31 to the output terminals OUT1 and OUT2, respectively.

Figure 17:
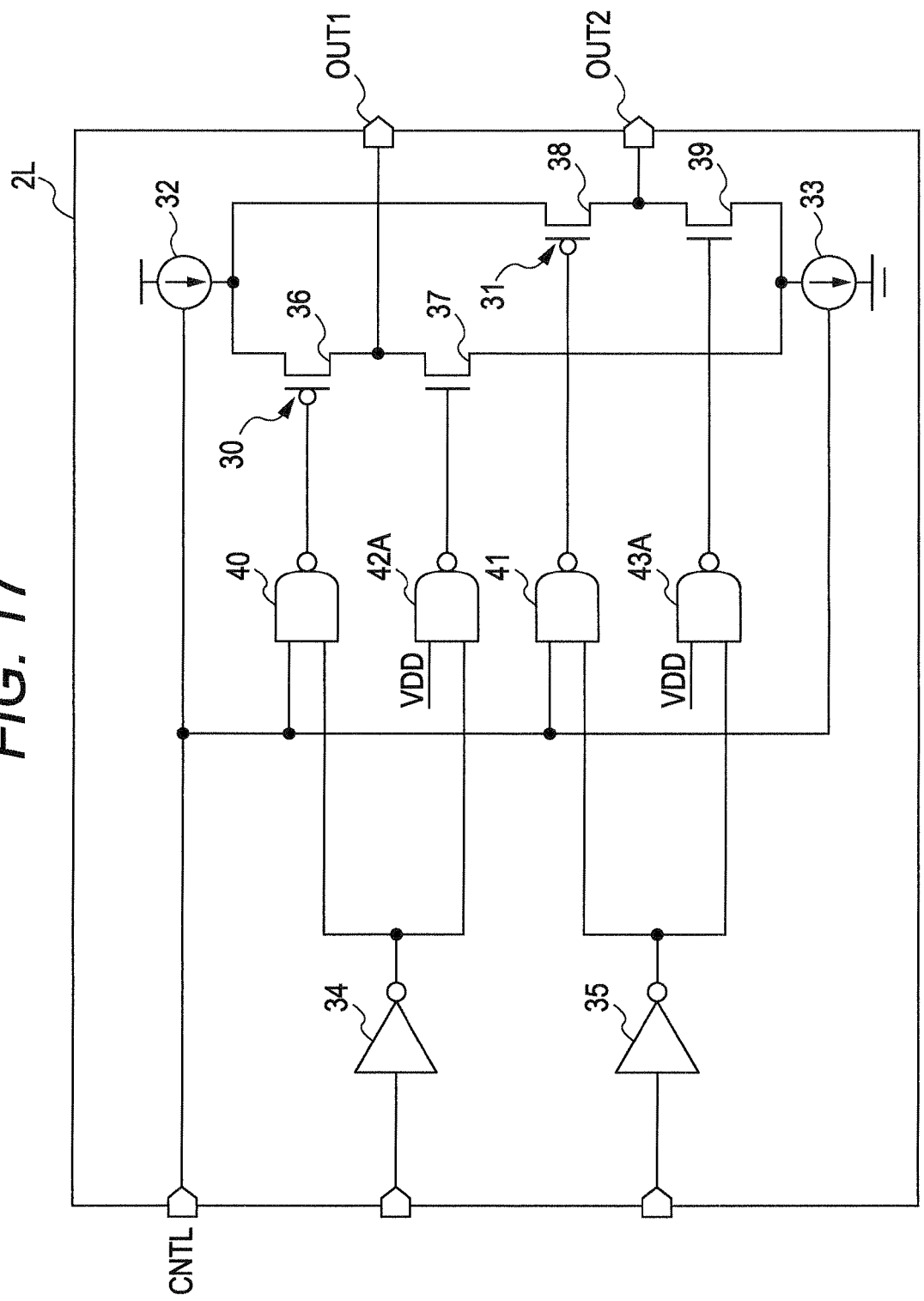
FIG. 17 is a diagram illustrating the structure of a differential output circuit according to a fifth embodiment.

FIG. 17 is a diagram illustrating the structure of a differential output circuit according to a fifth embodiment. In FIG. 17, the same components as those in FIG. 3 are denoted by the same reference numerals, and a description thereof will be omitted. A differential output circuit 2L illustrated in FIG. 17 includes NAND circuits 42A and 43A, instead of the inverters 42 and 43 of the differential output circuit 2C illustrated in FIG. 3. In this way, it is possible to make loads for input signals at the PMOS side and the NMOS side of the output driving circuit equal to each other.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:

1. A differential output circuit comprising:
    a first output driving circuit that includes a first PMOS transistor and a first NMOS transistor connected in series to each other;
    a second output driving circuit that includes a second PMOS transistor and a second NMOS transistor connected in series to each other; and
    a control circuit,
    wherein, when a control signal has a first value, the control circuit selectively turns on one of the first and second PMOS transistors and selectively turns on one of the first and second NMOS transistors, thereby controlling the first and second output driving circuits to output a first pair of differential signals, and
    when the control signal has a second value, the control circuit supplies no current to the first and second PMOS transistors and selectively turns on one of the first and second NMOS transistors, thereby controlling the first and second output driving circuits to output a second pair of differential signals.
2. The differential output circuit according to claim 1, further comprising:
    a first current source circuit that is connected in series to the first and second output driving circuits, wherein the amount of current flowing through the first current source circuit varies depending on the control signal.

3. The differential output circuit according to claim 2, wherein, when the control signal has the first value, the first pair of differential signals are differentially output from the first and second output driving circuits according to an LVDS standard, and when the control signal has the second value, the second pair of differential signals are differentially output according to a CML standard.

4. The differential output circuit according to claim 2, wherein the amount of current flowing through the first current source circuit varies depending on a selection signal in addition to the control signal.

5. The differential output circuit according to claim 4, wherein, when the control signal has the first value, the first pair of differential signals are differentially output from the first and second output driving circuits on the basis of the value of the selection signal, according to at least one of a subLVDS standard, an RSDS standard, and a mini-LVDS standard.

6. The differential output circuit according to claim 1, further comprising:

a second current source circuit that is connected in series to the first and second output driving circuits;

a circuit that detects a center voltage between the pair of differential signals output from the first and second output driving circuits; and a feedback circuit that changes the amount of current flowing through the second current source circuit according to a difference between the center voltage and a predetermined reference voltage.

7. The differential output circuit according to claim 6, wherein the value of the reference voltage is changed to set the center voltage to a different value.

8. The differential output circuit according to claim 2, further comprising:

a comparison circuit that compares a center voltage between the pair of differential signals output from the first and second output driving circuits with a predetermined threshold voltage, and changes the value of the control signal according to the comparison result.

9. The differential output circuit according to claim 6, wherein the first current source circuit is connected in series to a power supply voltage side of each of the first and second output driving circuits, and the second current source circuit is connected in series to a ground voltage side of each of the first and second output driving circuits.

10. The differential output circuit according to claim 6, wherein the first current source circuit is connected in series to a ground voltage side of each of the first and second output driving circuits, and the second current source circuit is connected in series to a power supply voltage side of each of the first and second output driving circuits.

* * * * *